United States Patent [19]

Schiek et al.

[11] Patent Number: 4,596,965

[45] Date of Patent: Jun. 24, 1986

[54] METHOD OF AND APPARATUS FOR DETERMINING AMPLITUDE RATIOS AND PHASE DIFFERENCES OF SIGNALS OF THE SAME FREQUENCY

[75] Inventors: Burkhard Schiek, Bochum; Uwe Gärtner, Wetter, both of Fed. Rep. of Germany

[73] Assignee: Bergwerksverband GmbH, Essen, Fed. Rep. of Germany

[21] Appl. No.: 653,730

[22] Filed: Sep. 21, 1984

[30] Foreign Application Priority Data

Sep. 21, 1983 [DE] Fed. Rep. of Germany ....... 3334061
Jul. 14, 1984 [DE] Fed. Rep. of Germany ....... 3425961

[51] Int. Cl.$^4$ ............................................. G01N 27/00
[52] U.S. Cl. .......................................... 331/65; 328/1; 340/870.25
[58] Field of Search ....................... 331/65; 332/16 R; 329/50, 145; 328/1, 4; 340/870.25, 602; 324/71.1, 118

[56] References Cited

U.S. PATENT DOCUMENTS

3,283,574 11/1966 Roth .................................. 328/1 X
3,545,258 9/1966 Judd ................................... 328/1 X Primary Examiner—Eugene R. LaRoche
Assistant Examiner—Robert J. Pascal
Attorney, Agent, or Firm—Karl F. Ross; Herbert Dubno

[57] ABSTRACT

An amplitude ratio and phase-difference analysis can be carried out with a measured object provided with a measured branch which is divided from a reference branch from a supply oscillator. The measured branch has $2^n$ switching combinations of phase shifters which are decoupled from one another and operated by a controller. The branches then feed a mixer and through a band-pass filter calculating circuit for determining the relative amplitude and phase which can be displayed on a register.

19 Claims, 7 Drawing Figures

METHOD OF AND APPARATUS FOR DETERMINING AMPLITUDE RATIOS AND PHASE DIFFERENCES OF SIGNALS OF THE SAME FREQUENCY

FIELD OF THE INVENTION

Our present invention relates to a method of determining amplitude ratios and phase differences of two harmonic signals of the same frequency which are modulated and then transformed by mixing with one another into a low-frequency signal from which desired information can be obtained with integration of this information with a reference measurement or with respect to a reference signal. The invention thus relates to a basic aspect of every homodyne network analysis. The invention also deals with an apparatus or device (circuit or system) for carrying out the method of the invention utilizing a high-frequency oscillator and a recording or registering unit.

BACKGROUND OF THE INVENTION

Homodyne network analysis processes have an advantage over heterodyne processes in that they can be carried out utilizing a single monochromatic high-frequency source. To recover the information with respect to magnitude and phase of the four-pole parameters to be determined into the low-frequency range in which they can be evaluated, a portion of the source signal must have a low-frequency modulation imposed thereon. The modulated source signal is then transmitted to the measured object and after the transmission of the reflection from the measured object, the reflected signal is mixed with an unmodulated portion of the source signal to effect the transfer to the low-frequency range. This modulation method determines whether the low-frequency information obtained can yield the desired four-pole parameter.

It is known, e.g. from *IEEE Trans. Microwave Theory Techn.* Vol. MTT-13 1965, page 371 ff, J. S. Jaffe, R. C. Mackey, that a homodyne network analyzer can be constructed using phase modulators which effect a sawtooth or step-function modulation with a fixed-phase variation of two (single sideband phase) modulators. This method has, however, disadvantages and sensitivities which prevent it from achieving high measurement accuracy over a wide frequency range at reasonable cost. In other words, any attempt to increase the precision of this earlier system results in a substantial increase in the cost of the circuit and the complexity thereof.

Single sideband modulators when used as phase modulators ensure a sufficient sideband suppression only upon precise preservation of the modulation form and variation degree and give rise to parasitic amplitude modulations resulting in measurement errors. Furthermore, an increase in precision is not possible through the use of simple means.

OBJECTS OF THE INVENTION

It is the principal object of this invention to provide a homodyne network analysis method which, notwithstanding the use of imperfect modulation elements, can accomplish high measurement precisions with long-term stability and which allows relatively inexpensively and simply, a refinement in precision to practically any desired degree and wherein the evaluation of the low-frequency information can be effected by a simple calculating process which can be realized by analog or digital methods.

Another object of the invention is to provide an apparatus, device, system or circuit for carring out this method.

SUMMARY OF THE INVENTION

These objects and others which will become apparent hereinafter are attained, in accordance with the present invention wherein:

(a) only a signal portion is modulated with the aid of a succession of phase shifters whose individual transmission phases can each have two states;

(b) the modulation is effected in such form that, within a measurement period, in succession, all $2^n$ combinations of the transmission phases of the n phase shifters are applied;

(c) the mixing of the two signals produces a product; and (d) the desired information is recovered from the low-frequency component of the mixer product of the two signals by combining the $2^n$ voltage values corresponding to the $2^n$ switching states of the phase shifter during a measuring period with complex sum $H_R$ in which each voltage value, weighted by an individual complex factor P, contributes to the sum of the individual weighting factors P of each switching state as determined by an individually set characteristic transfer function $q_i$, $i=1, \ldots, n$, of the n phase shifters and the number $\mu$ of the phase shifters whose transmission phases are in the second state, given by the relationship:

$$\underline{P} = (-1)^\mu \prod_{i=1}^{n} \frac{1}{q_i^*} \qquad \text{I}$$

The precision of the determined phase and amplitude values depends significantly upon the precision of the utilized weighting factors P, whereby inaccuracies or errors can be compensated or minimized simply by increasing the number of phase shifters because the deviation of the weighting factor from the optimum weighting factor will depend only upon the transfer functions of the phase shifters; an increased number of phase shifters with appropriate transfer functions can result in a closer approach to the ideal weighting factor P.

It has been found to be advantageous, especially to effect the decoupling of the phase shifter even with imperfect structural elements, to divide the end phase shifters for the two signal paths and to derive the weighting factor P from the individual transfer functions $q_i$, $i=1 \ldots, m$ of the m phase shifters of the first signal path and $q_l$, $l=m+1, \ldots, n$ where (n−m) phase shifters in the second signal path as well as the numer $\mu$ of phase shifters whose transmission phases are switched into the second state are determined by the following relationship:

$$\underline{P} = (-1)^\mu \prod_{i=1}^{m} \frac{1}{q_i^*} \prod_{l=m+1}^{n} \frac{1}{q_l} \qquad \text{II}$$

A simplification of the signal evaluation can be given for the case in which the weighting factor P using 0°/90° phase shifters has the values $\pm 1$, $+j$. In this case, each voltage value has either only a real part or only the imaginary part of the complex sum $H_R$.

If, for carrying out the process the only available phase shifters are those with unknown transfer functions or transfer functions which fluctuate sharply in the used frequency range, the determination of the weighting factors is difficult.

Such prior determinations are not required when three phase shifters are used and the desired information is recovered from the low-frequency parts of the mixed products of both signal components such that the eight switched sets of the phase shifters are read during one measuring period to yield the eight voltage values:

$u_1$ (no phase shifter is switched),
$u_2$ (1 phase shifter switched),
$u_3$ (2 phase shifters switched),
$u_4$ (3 phase shifters switched),
$u_5$ (1 and 2 phase shifters switched),
$u_6$ (1 and 3 phase shifters switched),
$u_7$ (2 and 3 phase shifters switched),
$u_8$ (1, 2 and 3 phase shifters switched)

so that these voltage values are combined to form the complex value $H_R$ in accordance with the relationship:

$$\underline{H_R} = u_1 +/-j \frac{u_1(u_1u_8 + u_2u_7 - u_3u_6 - u_4u_5) - 2u_2(u_1u_7 - u_3u_4)}{\sqrt{4(u_2u_8 - u_5u_6)(u_1u_7 - u_3u_4) - (u_1u_8 + u_2u_7 - u_3u_6 - u_4u_5)^2}} \quad \text{III}$$

To enable the use of a high dynamic range of the measuring process by selective amplification of the mixed products, the process can be modified in that an additional signal component is modulated with a low-frequency signal and the $2^n$ voltage values are recovered by phase sensitive rectification of the mixed product with the low-frequency modulation signal.

In many applications of the process of the invention, it is advantageous to prepare the desired information as to amplitude ratio and phase difference in the form of amplitude and phase values of a low-frequency signal. This can be achieved by:

(a) additionally modulating a signal component with a low-frequency signal of the frequency f, (b) effecting the $2^n$ combinations of the n transmission phases in a time-periodic process, (c) weighting the mixed product with $\pm 1$, $\pm j$ by a phase shifting thereof through 0°/180°, 90°/270°, and (d) recovering the desired information from the phase shifted mixed product such that the latter is band filtered at the frequency f of the low-frequency modulation and the amplitude and phase of the resulting signal is determined.

The generation of low-frequency signals with amplitude and phase corresponding to the sought information can be effected by:

(a) a band filter of the mixed product is effected at a frequency corresponding to the sum of the low-frequency modulation frequency f and the repetition frequency of $2^{(n-2)}f$ of the control process for the high-frequency phase shifter chain, (b) the weighting is carried out by shifting the mixed product by 0° or 180° whereby the $2^n$ switch combinations of the high-frequency phase-shifter chain are distributed over the $2^n$ partial intervals of a period while maintaining the conditions such that for a 0° low-frequency phase shift in 1, 5, 9 . . . partial intervals of a period (of a sequence of inervals 1, 2, 3, 4, 5 . . . , into which a period can be divided), the number of 0, 4, 8 . . switched high-frequency phase shifters of the characteristic switching state are involved; in the 1, 6, 10 . . . partial intervals of a period, the number of 1, 5, 9 . . . switched high-frequency phase shifters of the characteristic switching state are involved; in the 3, 7, 11 . . . partial intervals of a period the number of 2, 6, 10 . . . switched high-frequency phase shifters of the characteristic switching state are involved and in the 4, 8, 12 . . . partial intervals of a period, the number of 3, 7, 11 . . . switched high-frequency phase shifters of the characteristic switching state are involved. In a 0° low-frequency phase shift in the $i^{th}$ partial interval, while with 180° low-frequency phase shifting the $(i+2)^{th}$ or the $(i-2)^{th}$ partial intervals are established.

When the weighting factor P is $\pm 1$, $\pm j$ for the use of 0°/90° phase shifters, we may use an arrangement having an oscillator and an evaluator wherein:

(a) a signal distributor with a measuring branch and a reference branch is disposed each connected to the oscillator, (b) in the measuring branch, a chain of n mutually decoupled identical or nonidentical ideal or nonideal switchable 0°/90° phase shifters as well as a switch are so connected and actuatable from a control circuit that within a measuring period the $2^n$ switching combinations of the phase shifter in a closed condition of the switch are set one after the other and that the switch can be opened and the signal supplied to the measuring object, (c) the measuring branch and the reference branch work into a mixer forming a product modulator with a filter, (d) a subtraction circuit controlled by the aforementioned control circuit is connected to the mixer with its filter and an adding circuit also controlled by the control circuit is likewise provided ahead of the subtraction circuit, and (e) the addition circuit is combined via two signal paths with a calculating circuit controlled by the control circuit.

The mixer is so operated that it functions as a product modulator such that the measuring signal component is mixed with the reference signal component and after filtering out high-frequency signal components by a filter is transformed into $2^{(n+1)}$ direct current values ($U_F$) within a measuring period which contains the amplitude and phase information of the high-frequency signal from the measured object.

The direct current values $U_F$ of a measuring period are fed to the subtraction circuit which, operated by the control circuit, subtracts, when the switch is opened, the offset voltage from all $2^n$ voltage values $U_F$ corresponding to the switching states of the phase-shifter chain, so that the voltages, now freed from the offset, can be fed to the addition circuit operated by the control circuit and which with an infusion number of exactly 90° phase shifters, totals the values to a voltage sum. A number of 1, 5, 9 . . . phase shifters with corresponding values are negative and the number 3, 7, 11 switched phase shifters with corresponding values are positive and further the remaining switching combinations provide a sum of corresponding values to a voltage sum $U_R$ in which the number of 2, 6, 10 switched phase shifters of corresponding values are negative and the number of 0, 4, 8 switched phase shifters contribute positive values. The output signals $U_R$ and $U_I$ of the addition circuit are combined in a calculating circuit so that the relative amplitude of the high-frequency signal from the measured object is determined as a square root of the sum of the square of the values $U_R$ and $U_I$ and the relative phase of these signals is calculated as the arc tangent of the quotient of the values $U_I$ and $U_R$ whereby the multiple valued characteristic of the arc tangent function can be evaluated from the signs of the values $U_R$ and $U_I$.

When only high-frequency phase shifters with a minimum switching frequency range may be used, the switch which is employed to measure the offset component in the measuring branch can be eliminated so that during a measuring period only the $2^n$ switching combinations of the n phase shifters are established. The signal portion which is transmitted to the measured object is fed to the mixer where it is mixed with the reference signal component and after filtering out of the signal component with the frequency of the low-frequency oscillator in a band-pass filter, $2^n$ alternating current pulses within a measuring period are transferred to a low-frequency modulator which, under the control of the low-frequency oscillator, is so operated that it forms a product modulator and within a measuring period after filtering out of spurious alternating components in a filter, supplies $2^n$ direct current values to the addition circuit. An auxiliary modulation of sufficient frequency can enlarge the dynamic range of the process.

In the measuring branch, a high-frequency modulator can be provided which is supplied by a low-frequency oscillator with a periodic signal of the frequency $f_2$. This eliminates the need for the switching previously mentioned. In this case, the mixer is provided with a band-pass filter which is in turn connected to a low-frequency modulator energized by the low-frequency oscillator, the low-frequency modulator being operated so that it represents a product modulator. In this case the values of the mixer output signal can be simplified in that no low-frequency modulator is required as a product modulator which acts as an analog switching element with a continuous deviation from ideal behavior.

While apparatus as described is preferred for the evaluation of mixer output signals by digital calculating circuits, it is also possible to utilize systems for carrying out the process so that band-filter mixer output signals are of the same type as those of heterodyne or single side-band homodyne process whereby the evaluation circuit of the invention can be fully compatible with the earlier network analyzer. In this case, the high-frequency modulator generates symmetrical first side bands with a predetermined frequency spacing and the band-pass filter, instead of a low-frequency modulator, is connected to a peak value detector as well as a phase-comparator circuit which is controllable by the low-frequency oscillator.

When a switchable ideal or nonideal low-frequency 0°/90°/180°/270° phase shifter is provided between the mixer and band-pass filter and the band-pass filter includes an amplitude-measuring circuit which detects the relative amplitude of the high-frequency signal after passing the measured object, and a parallel connected phase-measuring circuit is provided for comparison of the phase of the low-frequency signal with the phase of the low-frequency oscillator, the relative phase of the high-frequency signal can also be determined after passing the measured object.

A substantial advantage of the invention is that the apparatus for carrying out the process needs only comparatively few nonideal and consequently low-cost modulation elements since the parameter changes of the phase shifter with time or frequency do not directly affect the measuring precision so that a system in accordance with the invention is potentially of high-band width and potentially of long-term measurement precision stability.

Indeed, the process can be a self-calibrating unit using at least three phase shifters, i.e. the transmission functions of the three phase shifters, and thus also the sought weighting factors can be exactly calculated from the measured voltages.

This makes it possible to carry out the process with any desired phase shifters without predetermination of their electrical characteristics and does not limit the process to 0°/180° phase shifters.

The process can be carried out for practically any frequency range up to the optical range. The requirement that the decoupling of all phase-shifter elements from one another be met can be accomplished by the use of phase shifters which are separated by isolating elements such as rectifier paths between the individual phase shifters. The apparatus and method of the invention have been found to be especially effective in industrial measuring devices, e.g. for remote measurements to be transmitted by telemetry or the like for moisture measurements, for distance measurements or other parameters which have been determined or where such measurements had previously been labor intensive.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
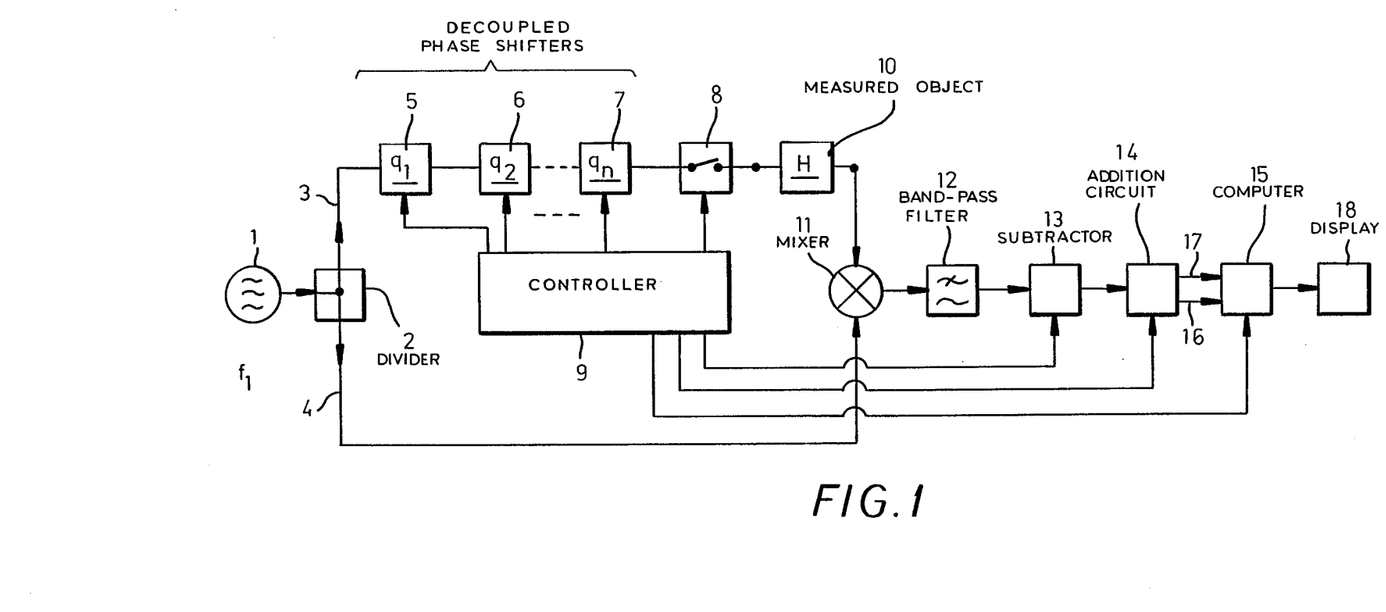
FIG. 1 is a block diagram illustrating an embodiment of the invention in which the phase shifter signal path is combined with the other signal in a mixer followed by a band-pass filter, subtractor and addition circuit.

The monochromatic output signal of frequency $f_1$ of a high-frequency oscillator 1 is fed to a signal splitter 2 which applies the signal to a measuring branch 3 and a reference branch 4 (FIG. 1).

The measuring branch component traverses a chain of n switchable phase shifters 5, 6, 7, whereby the $i^{th}$ phase shifter has a complex transfer function $q_i$ characteristic thereof and which in the unswitched state has the value 1 and in the switched state a complex value $k_i$. The signals then pass a switch 8 with a transfer function $S=1$ for the switched state and $S=0$ for the unswitched or cutoff state. The signal is then delivered to the measured object 10 characterized by having a complex transfer function H which is to be determined, whereupon the signal, duly modified by the modulation transfer functions and the measured-object transfer function is fed to a mixer 11. The other input to this mixer in the embodiment shown in FIG. 1 is the reference signal from the reference branch 4. The mixed product is applied to a filter 12 which removes high-frequency components and transforms the signal to a direct voltage $U_F$.

$U_F$ is determined by the relationship:

$$U_F = Re(\underline{A} \cdot S \cdot \underline{H} \cdot \underline{Q}) + U_{off} \tag{1}$$

(Re representing a real number or real portion of a complex number) from the mixer 11 which operates as a product modulator whereby the magnitude of the constant factor A is determined by the amplitude of the oscillator 1, the ground damping in the signal and reference branches and the conversion losses in the mixers 11, while its phase represents a constant phase difference between the signal and reference branches 3, 4.

The constant direct voltage magnitude $U_{off}$ is dependent upon the mixer offset produced by the mixer 11 and the complex value Q of the total transfer function of the phase-shifting chain 5, 7:

$$\underline{Q} = \prod_{i=1}^{n} q_i \tag{1a}$$

In an arrangement for carrying out the basic process of the invention the switch 8 is opened once within each measuring period and the subtraction circuit 13 is brought into play so that according to formula (1):

$$U_{off} = U_F(S=0) \tag{2}$$

and upon closing of switch 8, the voltage value $U_F$ $(S=1)$ is subtracted. Thus the subtraction circuit 13 yields voltage values $U_\nu$, $\nu = 1, 2 \ldots 2^n$ corresponding to the $2^n$ successively established combinations of the transfer functions $q_i$ of the n phase shifters 5–7 within the measuring period. In dependence upon the $\nu^{th}$ switching stage total transfer function $Q_\nu$, the phase shifter chain yields:

$$U_\nu = Re\{\underline{A} \cdot \underline{H} \cdot \underline{Q}_\nu\}, \nu = 1, 2, \ldots, 2^n \tag{3}$$

In the basic process, all $2^n$ voltage values $U_\nu$, correspond to the $2^n$ possible switching states of the phase shifter chain 5, 7, provided with individual weighting factors $P_\nu$ and are summed to a complex sum $H_R$:

$$\underline{H}_R = \sum_{\nu=1}^{2^n} \underline{P}_\nu \cdot U_\nu \tag{4}$$

The complex weighting factor of the individual transfer functions $q_i$ of the n phase shifters in the switching state and the number $\mu(\nu)$ of the phase shifters in this state are given by:

$$\underline{P} = (-1)^{\mu(\nu)} \prod_{i=1}^{n} \frac{1}{q_i^*} \tag{4a}$$

In this relationship, $q_i^*$ is the conjugated complex of $q_i$.

Each switching state $\nu$ of the phase-shifter chain 5, 7 is characterized by a natural number $\mu(\nu)$ which gives the number of switched phase shifters. It should be observed that all $2^n$ possible switched combinations of the phase-shifter chain 5–7 are established and that the resulting voltages according to equation (4) are summed. Furthermore, in each switched state $\nu$ only the $\mu(\nu)$ elements of the transfer function $Q_\nu$ (see equation 1a) or $\mu(\nu)$ elements weighting factors $P_\nu$ (see equation 4a) with a value unequal to 1 are involved and that $Q_\nu$ corresponds to a $\mu(\nu)$ fold-product of the corresponding $q_i\nu = k_i$ or $P_\nu$ is formed from a $\mu(\nu)$-fold product of the corresponding $(-1/k_i^*) = p_i$ (exception: ground state; in this state all phase shifters are unswitched; $Q = P = 1$). This allows the complex sum $H_R$ (equation 4) to be determined as follows:

$$\begin{aligned}\underline{H}_R = \tfrac{1}{2} \underline{A} \cdot \underline{H} \cdot &(1 + \underline{p}_1\underline{k}_1 + \underline{p}_2\underline{k}_2 + \underline{p}_3\underline{k}_3 + \ldots \\ &+ \underline{p}_1\underline{k}_1\underline{p}_2\underline{k}_2 + \underline{p}_1\underline{k}_1\underline{p}_3\underline{k}_3 + \underline{p}_2\underline{k}_2\underline{p}_3\underline{k}_3 + \ldots \\ &+ \underline{p}_1\underline{k}_1\underline{p}_2\underline{k}_2\underline{p}_3\underline{k}_3 + \ldots \\ &+ \\ &+ \\ &+ \underline{p}_1\underline{k}_1\underline{p}_2\underline{k}_2\underline{p}_3\underline{k}_3 \cdots \underline{p}_n\underline{k}_n) \\ + \tfrac{1}{2} \underline{A}^* \cdot \underline{H}^* \cdot &(1 + \underline{p}_1\underline{k}_1^* + \underline{p}_2\underline{k}_2^* + \underline{p}_3\underline{k}_3^* \\ &+ \underline{p}_1\underline{k}_1^*\underline{p}_2\underline{k}_2^* + \underline{p}_1\underline{k}_1^*\underline{p}_3\underline{k}_3^* + \underline{p}_2\underline{k}_2^*\underline{p}_3\underline{k}_3^* \\ &+ \underline{p}_1\underline{k}_1^*\underline{p}_2\underline{k}_2^*\underline{p}_3\underline{k}_3^* \\ &+ \\ &+ \\ &+ \underline{p}_1\underline{k}_1^*\underline{p}_2\underline{k}_2^*\underline{p}_3\underline{k}_3^* \cdots \underline{p}_n\underline{k}_n^*)\end{aligned} \tag{5}$$

This utilizes the equation:

$$Re[\underline{Z}] = \tfrac{1}{2}\underline{Z} + \tfrac{1}{2}\underline{Z}^* \tag{6}$$

Equation (6) can be transformed in the following form:

$$\underline{H}_R = \tfrac{1}{2} \underline{A}\cdot\underline{H}\cdot\prod_{i=1}^{n}(1+\underline{p}_i\underline{k}_i) + \tfrac{1}{2}\underline{A}^*\cdot\underline{H}^*\cdot\prod_{i=1}^{n}(1+\underline{p}_i\underline{k}_i^*) \tag{7}$$

If the partial weighting factors $p_i$ are strictly determined by the characteristic or individual transfer functions $k_i$, then $$\underline{p}_i = -\frac{1}{\underline{k}_i^*} \tag{8a}$$

This means that $$\underline{p}_i \underline{k}_i = -e^{j2\phi_i} \tag{8b}$$

and $$\underline{p}_i \underline{k}_i^* = -J \tag{8c}$$

whereby $\phi_i$ is the transmission phase of the $i^{th}$ phase shifter in the switched state.

In this case, $H_R$ from equation (7) can be given as $$\underline{H}_R = \underline{A} \cdot \underline{C} \cdot \underline{H} \tag{9}$$

and is thus except for a constant complex factor identical with the desired transfer function H.

To determine the absolute value of H in a standardization measurement of the measured object, it can be provided with a through connection in which $H_D = 1$. When, as described, 0°/90° phase shifters are used, the value of the signals can be simplified in that the voltages $U_\nu$ (see equation 3) can have alternating signs either for the real or the imaginary part of the value $H_R$ and the weighted summation according to equation (4) involves a simple summation of the real and imaginary parts without the requirement for a complex multiplication.

Consequently, for ideal 0°/90° phase shifters:

$$\underline{k}_i = e^i \tag{10a}$$

and thus all of the values $p_i$ can be fixed at $$\underline{p}_i = -j \tag{10b}$$

the weighting factor P can then be $$\underline{P}_\nu = (-j)^{\mu(\nu)} \tag{11}$$

so that only the values +1 and +j become significant. In this case $H_R$ from equation (4) is given by:

$$\underline{H}_R = \sum_{\nu=1}^{2^n} (-j)^{\mu(\nu)} \cdot U_\nu \tag{12}$$

or in another form from equation (8)

$$\underline{H}_R = \tfrac{1}{2} \underline{A} \cdot \underline{H} \cdot \prod_{i=1}^{n} (1 - j\underline{k}_i) + \tfrac{1}{2} \underline{A}^* \cdot \underline{H}^* \cdot \prod_{i=1}^{n} (1 - j\underline{k}_i^*) \tag{13}$$

From equation (10a)

$$-j \cdot \underline{k}_i = 1 \tag{10c}$$

and $$-j \underline{k}_i^* = -1 \tag{10d}$$

and therefrom $$\underline{H}_R = 2^{n-1} \cdot \underline{A} \cdot \underline{H} \tag{13a}$$

The value $H_R$ determined by the addition circuit 14 as to its real and imaginary parts is identical except for a constant complex factor with the transfer function H to be measured.

To form the square root from the sum of the squares, the signal paths 16, 17 are provided which feed to a calculator circuit 15 that determines the value of the magnitude $H_R$ and by forming the arc tangent of the quotient of $U_R$ by $U_I$, the phase of the value $H_R$, both of these values are displayed at 18 in the display or register unit.

When phase shifters are used which have deviations from nonideal characteristics:

$$\underline{k}_i = a_i \cdot e^{j(\pi/2 + \Delta\phi_i)}, \; a_i \neq 1, \; \Delta\phi_i \neq 0 \tag{14a}$$

For a wide range of the deviations:

$$|1 - j\underline{k}_i| > 1 \text{ und } |1 - j\underline{k}_i^*| < 1 \tag{14b}$$

As can be seen from formula (13), any desired precision can be obtained in the determination of the relative amplitude and phase of the transfer function H simply by selecting an appropriate number n of stages in the phase-shifter chain.

When the phase deviations amount to, for example, $\Delta\phi_i = \pm 10°$ with a parasitic damping of $\pm 1$ dB, the maximum measuring error of the relative phase (relative amlitude) is $\pm 12°$ ($\pm 1.7$ dB) for one stage, $\pm 1.3°$ ($\pm 0.2$ dB) for two stages, and $\pm 0.13°$ ($\pm 0.02$ dB) for three stages.

The residual measuring error which may enter into the weighting equation (8a) can be eliminated with a three-stage phase-shifter chain in which the eight voltage values $U_i$ are given from equation 3 and 1a as follows:

$$\begin{aligned}
U_1 &= \underline{A}\,\underline{H} & &+ \underline{A}^*\,\underline{H}^* \\
U_2 &= \underline{A}\,\underline{H}\,\underline{k}_1 & &+ \underline{A}^*\,\underline{H}^*\,\underline{k}_1^* \\
U_3 &= \underline{A}\,\underline{H}\,\underline{k}_2 & &+ \underline{A}^*\,\underline{H}^*\,\underline{k}_2^* \\
U_4 &= \underline{A}\,\underline{H}\,\underline{k}_3 & &+ \underline{A}^*\,\underline{H}^*\,\underline{k}_3^* \\
U_5 &= \underline{A}\,\underline{H}\,\underline{k}_1\,\underline{k}_2 & &+ \underline{A}^*\,\underline{H}^*\,\underline{k}_1^*\,\underline{k}_2^* \\
U_6 &= \underline{A}\,\underline{H}\,\underline{k}_1\,\underline{k}_3 & &+ \underline{A}^*\,\underline{H}^*\,\underline{k}_1^*\,\underline{k}_3^* \\
U_7 &= \underline{A}\,\underline{H}\,\underline{k}_2\,\underline{k}_3 & &+ \underline{A}^*\,\underline{H}^*\,\underline{k}_2^*\,\underline{k}_3^* \\
U_8 &= \underline{A}\,\underline{H}\,\underline{k}_1\,\underline{k}_2\,\underline{k}_3 & &+ \underline{A}^*\,\underline{H}^*\,\underline{k}_1^*\,\underline{k}_2^*\,\underline{k}_3^*
\end{aligned} \tag{15a-15h}$$

Solution of equations (15a–15h) yields $$2 \cdot \underline{A} \cdot \underline{H} = u_1 +/-j \frac{u_1(u_1 u_8 + u_2 u_7 - u_3 u_6 - u_4 u_5) - 2u_2(u_1 u_7 - u_3 u_4)}{\sqrt{4(u_2 u_8 - u_5 u_6)(u_1 u_7 - u_3 u_4) - (u_1 u_8 + u_2 u_7 - u_3 u_6 - u_4 u_5)^2}} \tag{16}$$

That means that the desired value H, except for a constant factor can be obtained strictly from the eight measured values A and the sign ambiguity of the imaginary part can be easily obtained by a standardization measurement.

A combination of the aforedescribed processes is also advantageous. From equations (15a)–(15b) and (16), $k_1$ can be given as $$\underline{k}_1 = \frac{(u_1 u_8 + u_2 u_7 - u_3 u_6 - u_4 u_5) +/-j \sqrt{4(u_2 u_8 - u_5 u_6)(u_1 u_7 - u_3 u_4) - (u_1 u_8 + u_2 u_7 - u_3 u_6 - u_4 u_5)^2}}{2(u_1 u_7 - u_3 u_4)} \tag{17}$$

This has as a consequence the precise determination of the values $k_{1,2,3}$ in a standardization cycle so that these values can be used according to equation 8a as precise standard factors in a process as previously described. This can be advantageous because it allows a determination of H as minimal calculating cost and by direct calculation in accordance with equation (16).

In many applications, it can be advantageous to obtain at the mixer output alternating current signals of a higher frequency than the switching frequency of the phase-shifter chain 5–7, with these signals upon elimination of the mixer offset being selectively amplified.

Figure 7:
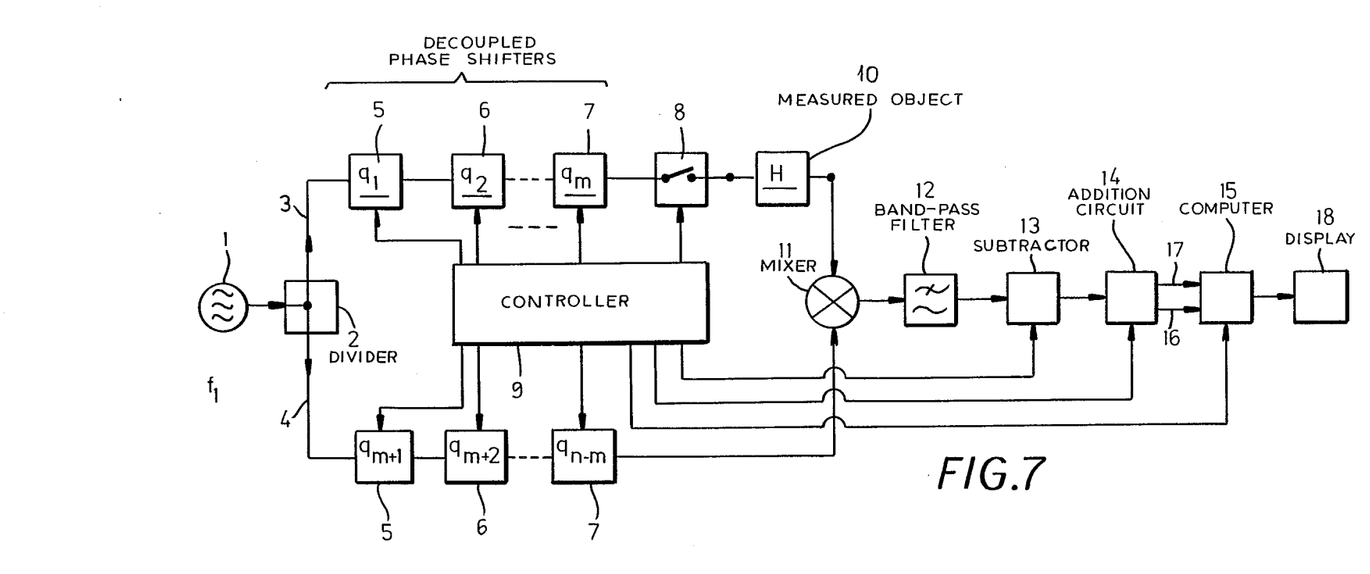
FIG. 7 is a block diagram similar to FIG. 1 in which the phase shifters are distributed over both signal paths.

FIG. 7 shows that n phase shifters can be divided along both signal paths and the weighting factor P is determined from the individual transfer functions $q_i$, $i=1,\ldots,m$, for the m phase shifters in the first of these signal paths and $q_l$, $l=m+1,\ldots,n$ of the $(n-m)$ phase shifters in the second of these signal paths as well as from the total number $\mu$ of the phase shifters whose transfer phases are in the second state in accordance with the relationship $$\underline{P} = (-1)^\mu \prod_{i=1}^{m} \frac{1}{\underline{q}_i^*} \prod_{l=m+1}^{n} \frac{1}{\underline{q}_l}.$$

Figure 2:
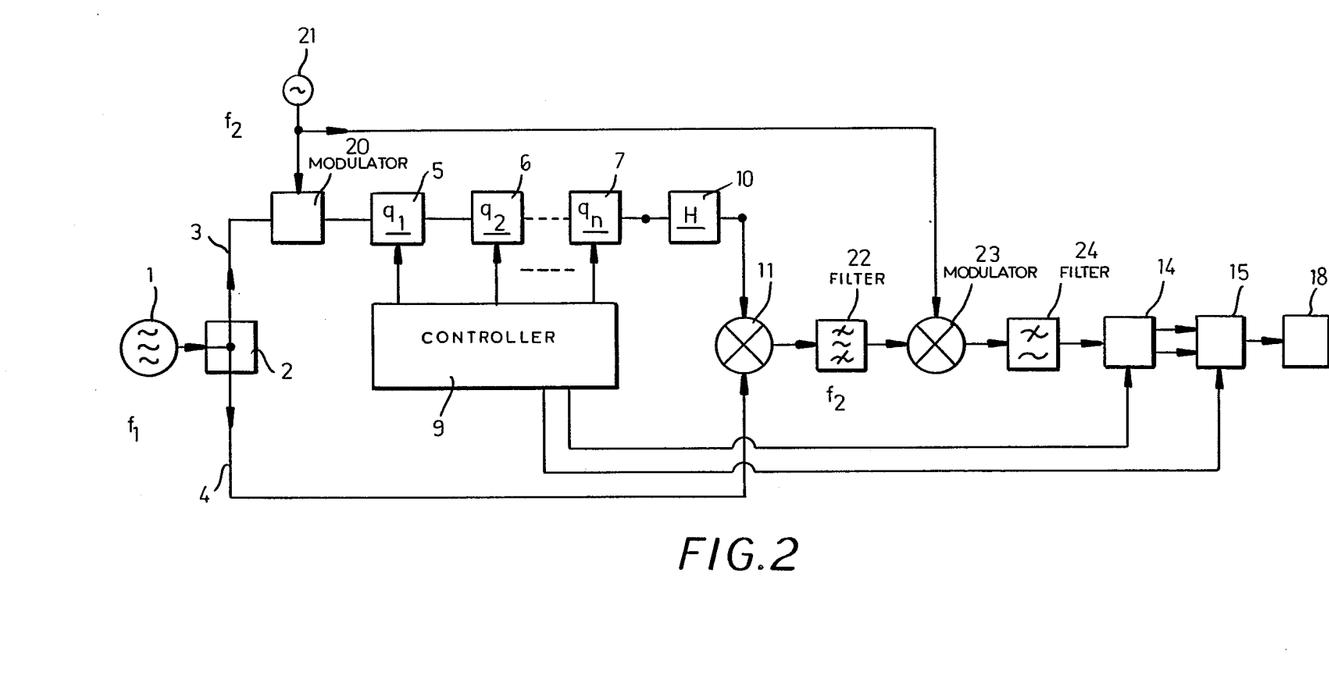
FIG. 2 illustrates in block diagram form another embodiment of the invention wherein a filter is provided downstream of the modulator and is followed by another modulator and filter.

In FIG. 2, a high-frequency modulator 20 can be inserted in the signal path ahead of the phase-shifter chain 5–7 and the measured object 10. The high-frequency modulator 20 receives its modulating frequency from a low-frequency oscillator 21 of frequency $f_2$ to generate a spectrum with side bands of the frequency $f=f_1 \pm mf_2$, $m=0, 1, 2 \ldots$ The mixer product of the first upper and lower side bands is separated out in a band filter 22. The modulation signal of frequency $f_2$ is also delivered to a product modulator low-frequency modulator 23 which receives the output from band filter 22 rectified and having a sign determined by its phase. Upon the filtering out of alternating component perturbations, a direct voltage signal U is obtained which is coupled to the addition circuit 14. The latter depicts the complex vector U amplitude and 0 phase of a monochromatic signal.

The complex amplitude of the first upper or lower side band from the measured object 10, $U_o$ or $U_u$ are given by $$\underline{U}_o = \underline{A}_l \underline{U}_{mod} \underline{H}_o \underline{Q}_o \tag{18a}$$

or $$\underline{U}_u = \underline{A}_l \underline{s} \underline{U}_{mod} \underline{H}_u \underline{Q}_u \tag{18b}$$

in which $A_l$ represents a general amplitude and phase factor, $U_{mod}$, a complex amplitude of the modulation signal and s is a complex factor which can be understood as the suppression of the first lower side band with respect to the first upper side band by the high-frequency modulator 20.

The transfer function of the measured object in the upper and lower side band is designated by $H_o$ or $H_u$, while the transfer function of the phase-shifter chain is represented at $Q_o$ or $Q_u$, respectively, in the upper and lower side bands.

The complex amplitude after mixing and band filtration of the signal supplied to the product modulator 23 at frequency $f_2$ is thus $$\underline{U}_F = \underline{A}_2 \underline{U}_{mod} (\underline{H} \cdot \underline{Q} \cdot \underline{S}^* \cdot \underline{H}^* \cdot \underline{Q}^*) \tag{19}.$$

After the phase-sensitive rectification and filtration in filter 24, each depending upon the switching state $\nu$ of the phase-shifter chain 5–7, a direct voltage $$U_\nu = Re\{\underline{A} \cdot (\underline{H} \cdot \underline{Q} + \underline{S}^* \cdot \underline{H}^* \cdot \underline{Q}^*)\} \tag{20}$$

is fed to the addition circuit 14. By selection of a small frequency ratio $f_2/f$, we can always ensure that the transfer function of the measured object and that of the phase-shifter chain will be identical in the upper and lower side-band frequencies so that $H_o = H_u = H$ and $Q_o = Q_u = Q$. The coupling of the $2^n$ voltages U in the addition circuit 14 supplies again the real and imaginary parts of the complex value $H_R$ $$\underline{H}_R = \tfrac{1}{2} \underline{H} \cdot (\underline{A} + \underline{A}^* \underline{S}) \cdot \prod_{i=1}^{n} (1 - j\underline{k}_i) + \tfrac{1}{2} \underline{H}^* (\underline{A}^* + \underline{A}\,\underline{S}^*) \cdot \tag{21}$$

$$\prod_{i=1}^{n} (1 - j\underline{k}_i^*)$$

A comparison of equation (21) with equation (13) shows that it is possible to make a determination of relative amplitude and phase with equal precision where the device comprises the oscillator 21 and the modulators 20 and 23 as in the embodiment of FIG. 1. However, in this case, the circuit elements required for measuring the mixer offset can be eliminated.

Figure 3:
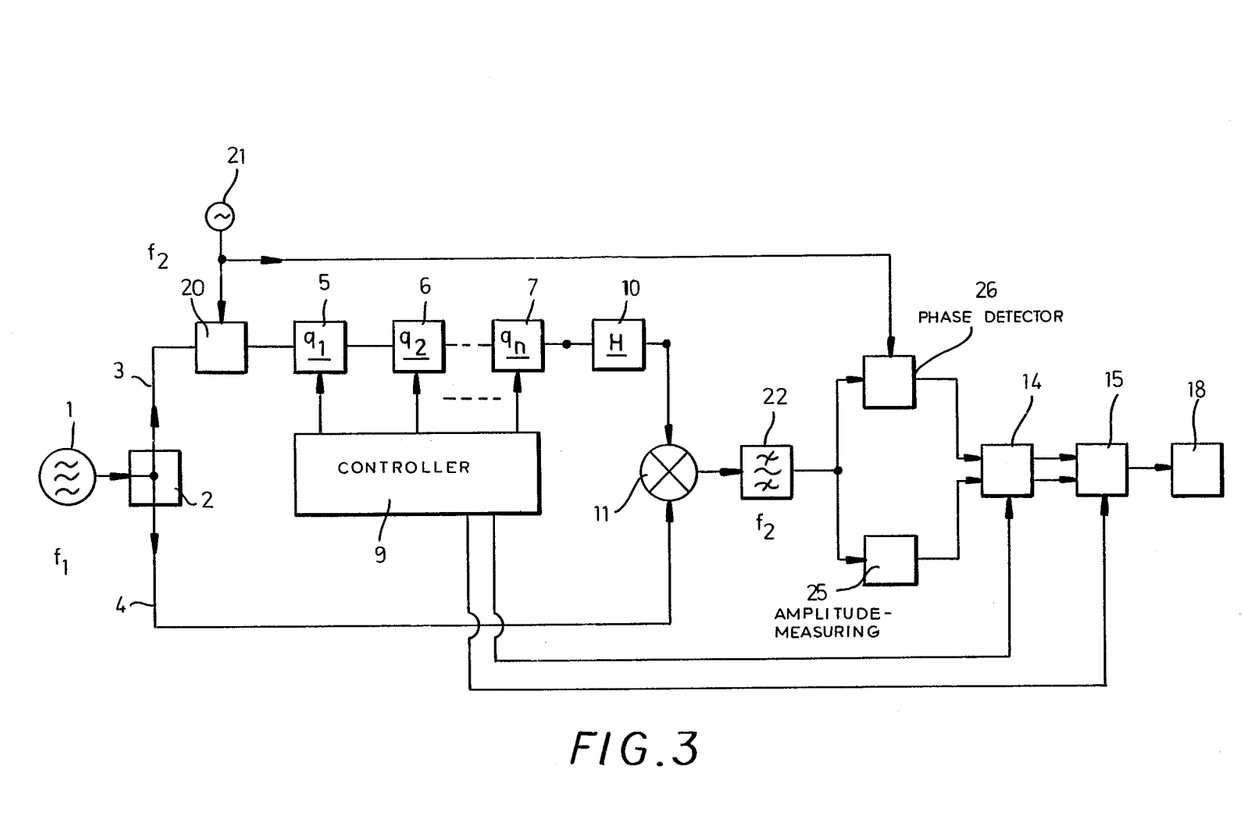
FIG. 3 is a block diagram of a circuit in which following the filter a phase detector is provided in parallel with an amplitude measuring circuit to feed the addition circuit.

FIg,. 3 illustrates schematically a modification which utilizes the low-frequency oscillator 21 and the modulator 20. This embodiment differs from that of FIG. 2 in that the modulator 20 here generates a spectrum with symmetrical first side bands. This can be accomplished using an amplitude modulator.

In this case, $S=1$ and the complex amplitude of the mixer-output signal subjected to band filration at frequency $f_2$ is given from equation 19 as:

$$\underline{U}_F = 2 \cdot \underline{A}_2 \cdot \underline{U}_{mod} \cdot Re\{\underline{H} \cdot \underline{Q}\} \tag{22}$$

This signal is fed to a peak-value rectifier which supplies the magnitude of the direct voltage $U_\nu$ which depends upon the switching state $\nu$ of the phase-shifter chain.

$$|U_\gamma| = 2 \cdot |\underline{A}_3| \cdot |Re\{\underline{H} \cdot \underline{Q}\}| \tag{23}$$

The phase of $U_F$ can, as will be apparent from equation (22), only take two states in dependence upon the switch state $\nu$ corresponding to the sign of the direct voltate $U_\nu$.

A phase-comparison circuit 26 is supplied with a signal of the complex amplitude $U_{mod}$ as a reference and detects the phase state of $U_F$ and supplies this information to the addition circuit 14 which combines this information with the magnitude and sign corrected voltage $U_\nu$ according to equation (12) to yield the desired value $H_R$.

An advantage of this configuration of the circuitry and this method of operating is that for the high-frequency modulation we are able to use a simple amplitude modulator while, for the evaluation, the product modulator can be analogously replaced by a peak-value detector 25 and a phase-comparison circuit 26 which only are required to distinguish between two switching states and easily can be realized in digital circuitry while the circuit which they replace is generally an analog circuit.

In many cases it is advantageous to measure the transfer function of the measured object in upper and lower side bands separately. An arrangement for doing this has been illustrated in FIG. 4.

Figure 4:
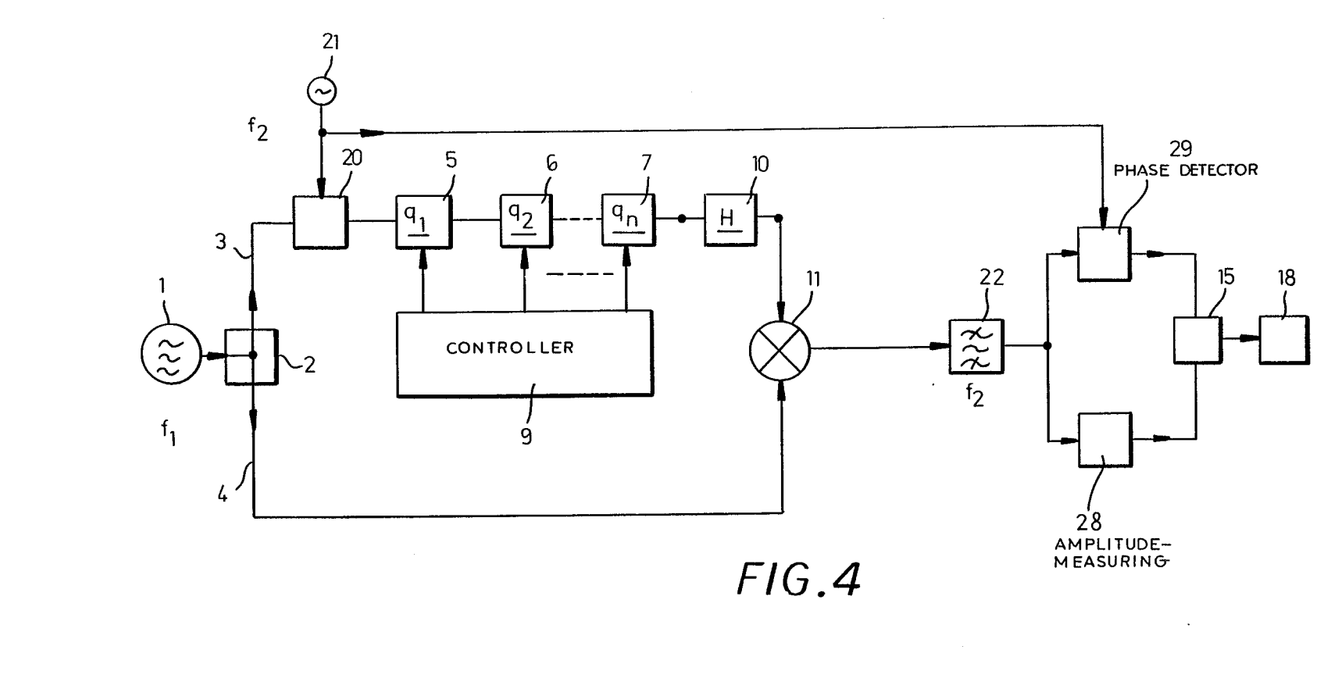
FIG. 4 is a block diagram of a circuit similar to FIG. 3 in which the phase detector and amplitude measuring circuit feed the computer directly.

While much of the circuit of FIG. 4 has already been described and need not be reviewed since reference numerals are utilized to describe identically functioning elements throughout the circuits, in this embodiment the mixed product from the band filter 22 with a pass band at frequency $f_2$ is delivered to a phase-measuring circuit 29 and an amplitude-measuring circuit 28 to provide measurements of amplitude and phase is complex form. The information is supplied to a calculator 15 directly which separates the transfer functions of the measured objects for the upper and lower side bands and displays them at 18.

According to equation (19), the complex amplitude of the band-filtered mixer output signal $U_F$ is given by $$\underline{U}_F = \underline{A}_2 \cdot U_{mod} \cdot (\underline{H} \cdot \underline{Q} + \underline{S}^* \cdot \underline{H}^* \cdot \underline{Q}^*) \tag{19}$$

When in use, for example, two switchable phase shifters (n=2) in the measuring branch, this complex value can be determined by having the control circuit 9 establish four switch combinations with the complex values:

$$\begin{aligned}
\underline{U}_{F1} &= \underline{K}\,\underline{H}_0 & &+ \underline{s}^* \underline{K}^* \underline{H}_u^* \\
\underline{U}_{F2} &= \underline{K}\,\underline{H}_0\,\underline{k}_{10} & &+ \underline{s}^* \underline{K}^* \underline{H}_u^* \underline{k}_{1u}^* \\
\underline{U}_{F3} &= \underline{K}\,\underline{H}_0\,\underline{k}_{20} & &+ \underline{s}^* \underline{K}^* \underline{H}_u^* \underline{k}_{2u}^* \\
\underline{U}_{F4} &= \underline{K}\,\underline{H}_0\,\underline{k}_{10}\,\underline{k}_{20} & &+ \underline{s}^* \underline{K}^* \underline{H}_u^* \underline{k}_{1u}^* \underline{k}_{2u}^*
\end{aligned} \tag{24a-24d}$$

Here K is a generally complex factor and $k_{1o}$, $k_{2o}$ or $K_{1u}$, $k_{2u}$ represent the transfer functions of the phase shifters in the switched states for the frequencies of the upper and lower side bands, respectively. These complex voltages can then be measured and by analogy to equation (4), summed to a switched sum $H_R$:

$$\underline{H}_R = \sum_{\nu=1}^{2^n} \underline{P}_\nu \underline{U}_{F\nu} \tag{25}$$

This complex sum 25 can by analogy to equation (7) be brought into the form $$\underline{H}_R = \underline{K}\,\underline{H}_0(1 + \underline{p}_1\underline{k}_{10})(1 + \underline{p}_2\underline{k}_{20}) + \tag{26}$$

$$\underline{s}^* \underline{K}^* \underline{H}_u^* (1 + \underline{p}_1\underline{k}_{1u}^*)(1 + \underline{p}_2\underline{k}_{2u}^*)$$

(as given by example for n=2).

If the partial weighting factors $p_i$ are determined by the individual transfer functions $k_{iu}$ of the phase shifters by analogy to equation 8a for the lower side-band frequency as $$\underline{p}_i = \frac{1}{\underline{k}_{iu}^*} \tag{27}$$

equation 26 reduces to $$\underline{H}_R = \underline{c}_o \underline{H}_o \tag{28}$$

If $p_i$ is selected so that $$\underline{p}_i = \frac{1}{\underline{k}_{io}} \tag{29}$$

then $$\underline{H}_R = \underline{c}_u^* \underline{H}_u^* \tag{30}$$

in which $c_o$ and $c_u$ are general complex constants independent of the measured object. Consequently, the transfer function of the measured object in the upper side band $H_o$ can be enabled by the general selection of the weighting factor $$\underline{P}_o = (-1)^\mu \prod_{i=1}^n \frac{1}{\underline{q}_{iu}^*} \tag{31a}$$

for the switch state $\nu$ while for the determination of $H_u$ the selection $$\underline{P}_u = (-1)^\mu \prod_{i=1}^n \frac{1}{\underline{q}_{io}} \tag{31b}$$

will be necessary.

With the embodiment of FIG. 4, residual measuring errors which might affect the weighting or conditions represented by equations 31a or 31b, can be eliminated.

By the use of a two-stage phase-shifter chain, it is possible to obtain the four complex filter voltages $U_{F1}$–$U_{F4}$ corresponding to equations 24a–24d.

Under the assumption that the transfer functions of the phase shifters $k_1$, $k_2$ for the upper and lower side bands are identical, $k_{1o}=k_{1u}=k_1$ and $k_{2u}=k_{2o}=k_2$ and the equation system (24a–24d) allows direct calculation of $k_1$ as follows:

$$\underline{k}_1^* = -\frac{IM\{\underline{U}_{F1}^*\underline{U}_{F4} + \underline{U}_{F2}^*\underline{U}_{F3}\}}{2IM\{\underline{U}_{F1}\underline{U}_{F3}^*\}} \tag{32}$$

$$+/- J\sqrt{-\frac{IM\{\underline{U}_{F1}^*\underline{U}_{F4} + \underline{U}_{F2}^*\underline{U}_{F3}\}^2}{4IM\{\underline{U}_{F1}\underline{U}_{F3}^*\}^2} + \frac{IM\{\underline{U}_{F2}\underline{U}_{F4}^*\}}{IM\{\underline{U}_{F1}\underline{U}_{F3}^*\}}}$$

The sign ambiguity can be eliminated by a calibration or standard measurement as was described with reference to equation (16). From the resulting values $k_1$, the desired transfer functions in the upper and lower side bands for the measured object are given by $$\underline{H}_{Ro} = \frac{\underline{U}_{F1}\underline{k}_1^* - \underline{U}_{F2}}{2jIM\{\underline{k}_1^*\}} \tag{33}$$

$$\underline{H}_{Ru} = \frac{\underline{U}_{F1}^*\underline{k}_1^* - \underline{U}_{F2}^*}{2jIM\{\underline{k}_1^*\}} \tag{34}$$

The constant K and s are also obtained by a calibration measurement.

Figure 5:
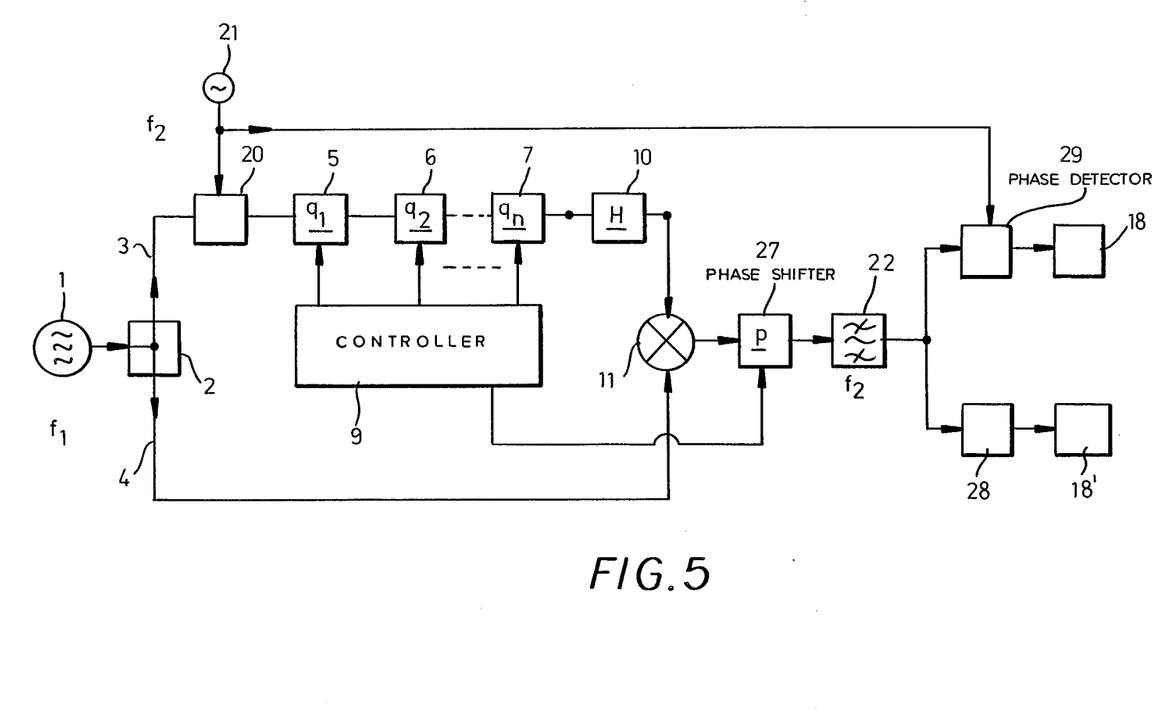
FIG. 5 is a block diagram of yet another embodiment in which the phast detector and amplitude measuring circuits feed still other elements.

A particularly effective embodiment in which the addition circuit operates by the analog approach has been represented in FIG. 5. In this embodiment the weighting of the recovered direct voltage with the complex factors $(-j)^{\mu(\nu)}$ corresponding to equation (12) is effected by an additional phase shifting of the low-frequency signal in 0°/90°/180°/270° phase shifter 27. In this case it is the same whether the low-frequency phase shifting is established by the mixer output signal or by the modulation signal $U_{mod}$. For the band filtration of the low-frequency oscillator in the filter 22, the output of which corresponds in amplitude and phase to the relative amplitude and phase of the desired value H, the control of the high-frequency phase shifters 5–7 and the low-frequency phase shifter 27 by the controller 9 is effected so that these are operated periodically and, in a period of the duration $T_S$, all $2^n$ switch states of the phase shifter are established for the same time interval $\Delta t = T_S \cdot 2^{-n}$. The contribution of the controller 9 to the low-frequency phase shift for each switch state $\nu$ is prescribed by the transfer function P of the low-frequency phase shifter 27.

The mixed product of the first upper and lower side bands generated by side bands 20 are additionally amplitude- and phase-modulated with a periodic function of the ground frequency $f_S = 1/T_S$ with the frequency $f_S$ being related to the frequency $f_2$ by the relationship $$f = f_2 \pm m f_S \quad (35)$$

when $m = 0$, $f = f_2$ and the combination of the first side bands with the direct component of the periodic modulation function in frequency band $f_2$ is eliminated.

The amplitude $H_R$ of the signal band filtered at $f_2$ is then $$H_R = \underline{A}_4 \cdot \underline{U}_{mod} \cdot \frac{1}{T_S} \cdot \int_0^{T_S} \underline{P}(t) \cdot (\underline{Q}(t) \cdot \underline{H} + \underline{Q}^*(t) \cdot \underline{S}^* \cdot \underline{H}^*) dt \quad (36)$$

$$= \underline{A}_4 \cdot \underline{U}_{mod} \cdot 2^{-n} \cdot \sum_{\nu=1}^{2^n} \underline{P}_\nu \cdot (\underline{Q}_\nu \cdot \underline{H} + \underline{Q}_\nu^* \cdot \underline{S}^* \cdot \underline{H}^*)$$

When the weighting factor P for 0°/90° phase shifters assumes the values $\pm 1$, $+j$, the phase shift of the low-frequency filter 27 for each switch state is so selected that $$\underline{P}_\gamma = (-j)^{\mu(\nu)} \quad (37)$$

and a comparison of equation (36) with equations 20 and 21 shows that equation (36) allows the complex amplitude of the band filtered output signal of frequency $f_2$ to be calculated as follows:

$$\underline{H}_R = \underline{A}_5 \cdot \underline{H} \cdot \prod_{i=1}^n (1 - j\underline{k}_i) + \underline{A}_5^* \cdot \underline{H}^* \cdot \prod_{i=1}^n (1 - j\underline{k}_i^*) \quad (38)$$

so that the band-filtered output signal has a sufficient number of stages n of the phase-shifter chain will have an amplitude and phase corresponding to the relative amplitude and relative phase of the measured value H with high precision.

When the low frequency 0°/90°/180°/270° phase shifter is replaced by a simple low-frequency 0°/180° phase shifter with the transfer function $p = \pm 1$, a modulation product of higher order m (see equation 36) can be evaluated.

Under these circumstances from the periodically switched high-frequency chain and the correspondingly switched low-frequency phase shifter 27, an amplitude and phase-modulation function is obtained from which the complex amplitude $C_i$ of the $i^{th}$ harmonic is represented by the formula 39

$$\underline{C}_i = \frac{1}{T_S} \cdot \int_0^{T_S} \underline{P}(+) \cdot (\underline{Q}(t) \cdot \underline{H} + \underline{Q}^*(t) \cdot \underline{S}^* \cdot \underline{H}^*) e^{-ji\omega_S t} dt \quad (39)$$

$$= \underline{C} \cdot \sum_{\nu=1}^{2^n} \underline{P}_\nu \cdot e^{-j(\nu-1)\frac{\pi}{2} i 2(2-n)} (\underline{Q}_\nu \cdot \underline{H} + \underline{Q}_\nu^* \cdot \underline{S}^* \cdot \underline{H}^*)$$

If in accordance with equation (36) all $2^n$ switch states of the phase shifter chain 5–7 are uniformly distributed over the interval [O, $T_S$], for $i = 2^{(n-2)th}$ harmonic with $P = \pm 1$ by appropriate selection of the switch states in the interval [O, $T_S$], $$\underline{P}_\gamma \cdot e^{-j\pi/2 \, i2(2-n)} = (-j)^{\mu(\nu)} \quad (40)$$

It is always possible to match the frequency $f_2$ of the low-frequency oscillator 21 and the repetition frequency $f_S$ of the switching process of the phase-shifter chain 5–7 with one another so that in the filtered-out frequency range of the frequency $f = f_2 + 2^{(n-2)} \cdot f_S$ so that only the desired signal component is obtained which by modulation of the first side band of the high-frequency modulator with the $2^{(n-2)th}$ harmonic of the amplitude and phase-modulation function of the phase-shifter chain 5–7 and the low-frequency phase shifter 27 results. In this manner the complex amplitude of the band-filtered signal $H_R$ is given by equation (39).

Figure 6:
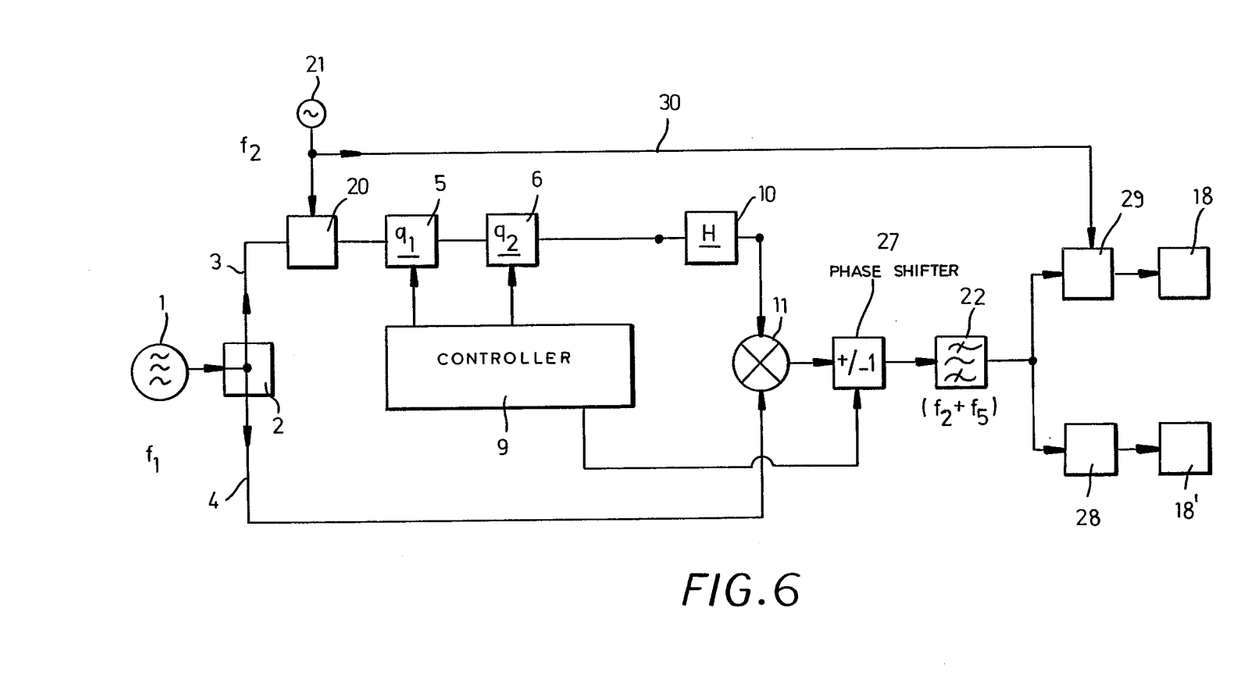
FIG. 6 is a block diagram showing an embodiment in which a phase shifter is provided between the modulator and the band pass filter.

This embodiment of the invention has been presented in FIG. 6 for the case in which $n = 2$.

In the case in which two elements 5, 6 are used, there are four possible switch combinations:

$$
\begin{aligned}
\nu &= 1: q_1 = 1, q_2 = 1; & \mu(\nu) &= 0 \\
\nu &= 2: q_1 = 1, q_2 = k_2; & \mu(\nu) &= 1 \\
\nu &= 3: q_1 = k_1, q_2 = k_2; & \mu(\nu) &= 2 \\
\nu &= 4: q_1 = k_1, q_2 = 1; & \mu(\nu) &= 1
\end{aligned}
\quad (41)
$$

To fulfill the requirements of equation (40), control function of the low-frequency phase shifter 27 in this example must be selected so that $p_1 = p_2 = p_3 = 1$ and $p_4 = -1$ and the filtration of the mixed output signal is effected at the frequency $f = f_2 + f_S$.

The complex amplitude of the band-filtered output signal is given by equation (39) as follows:

$$\underline{H}_R = \underline{A} \cdot \underline{H} \cdot (1 - j\underline{k}_1) \cdot (1 - j\underline{k}_2) + \underline{A}^* \cdot \underline{H}^* \cdot (1 - j\underline{k}_1^*) \cdot (1 - j\underline{k}_2^*), \quad (42)$$

This represents a corresponding real time signal $$U(t) = Re\{\underline{H}_R \cdot e^{j2\pi(f_2 + f_S)t}\} \quad (43)$$

For the case of ideal 0°/90° phase shifter (compare equations 10c and 10d), the amplitude and phase of the measured value H are given by the time function:

$$U(t) = |\underline{A}_5| \cdot |\underline{H}| \cdot \cos\{2\pi(f_2 + f_S) + \phi_A + \phi_H\} \quad (44)$$

This signal can be easily measured in the low-frequency amplitude and phase-measuring circuits 28 and 29, respectively. At 30 we have represented the circuit branch which connects the low-frequency oscillator 21 with the phase-measuring circuit 29.

We claim:

1. A method of determining the amplitude ratio and the phase difference of two signals of the same frequency, which are modulated and are then transformed into a low-frequency signal by mixing with one another and from which desired information is obtained with respect to a reference measurement, the improvement wherein:
   (a) only one signal component is modulated with a chain of n phase shifters whose individual transfer phases can each have two states;
   (b) the modulation is carried out so that within a measuring period, one after the other, all $2^n$ combinations of the transfer phases of the n phase shifters are established;
   (c) the mixing of both signals forms a product of the signals; and (d) the desired information is recovered from a low-frequency component of the mixed product of both signals by combining $2^n$ voltage values respectively corresponding to the $2^n$ switching states of the phase shifter during a measuring period to a complex sum $H_R$, in which each voltage value is weighted with an individual complex factor $P$ which contributes to the complex sum and the individual weighting factor $P$ of each switching state is given in terms of the individual transfer functions $q_i$, 1, ... n for the respective switching states and n phase shifters and by the number $\mu$ of the phase shifters which have respective phase-shifter transfer phases in the second state as follows:

$$\underline{P} = (-1)^\mu \prod_{i=1}^{n} \frac{1}{q_i^*} \tag{A}$$

2. The improvement in claim 1 wherein the n phase shifters are divided along both signal paths and the weighting factor P is determined from the individual transfer functions $q_i$, i = 1, ..., m, for the m phase shifters in the first of these signal paths and $q_l$, l = m+1, ..., n of the (n−m) phase shifters in the second of these signal paths as well as from the total number $\mu$ of the phase shifters whose transfer phases are in the second state in accordance with the relationship $$\underline{P} = (-1)^\mu \prod_{i=1}^{m} \frac{1}{q_i^*} \prod_{l=m+1}^{n} \frac{1}{q_l} \tag{B}$$

3. The improvement defined in claim 1 wherein said phase shifters are 0°/90° phase shifters having weighting factors P of the value $\pm 1$, $\pm j$.

4. The improvement defined in claim 1 wherein:
(a) one signal component is modulated with three phase shifters; and
(b) the desired information is so recovered from the low-frequency component of the mixed product of both signal components that the eight switch states of the three phase shifters during a measuring period correspond to eight voltage values: $U_1$ in which no phase shifter is switched, $U_2$ in which a first phase shifter is switched to the second switch state, $U_3$ in which a second of said phase shifters is switched to the second switch state, $U_4$ in which the third of said phase shifters is switched to said second switch state, $U_5$ in which the first and second phase shifters are switched to the second switch state, $U_6$ in which the first and third phase shifters are switched to the second switch state, $U_7$ in which the second and third phase shifters are switched to the second switch state, and $U_8$ in which the first, second and third phase shifters are all switched to the second switch state and the voltage values $U_1-U_8$ are combined to said complex value $H_R$ in accordance with the relationship $$\underline{H}_R = u_1 + /- j \frac{u_1(u_1u_8 + u_2u_7 - u_3u_6 - u_4u_5) - 2u_2(u_1u_7 - u_3u_4)}{\sqrt{4(u_2u_8 - u_5u_6)(u_1u_7 - u_3u_4) - (u_1u_8 + u_2u_7 - u_3u_6 - u_4u_5)^2}} \tag{C}$$

5. The improvement defined in claim 4 wherein, in addition, one signal component is modulated with a low-frequency signal and the combined $2^n$ voltage values are recovered by phase-sensitive rectification of the mixed product with the low-frequency modulation signal.

6. The improvement defined in claim 1 wherein, in addition, one of said signal components is modulated with a harmonic low-frequency signal of the frequency f and the mixed product is band filtered at said frequency f and measured by complex measurement with respect to magnitude and phase so that the recovered $2^n$ complex voltage values are combined to two complex sums $H_{Ro}$ and $H_{Ru}$ utilizing weighting factors $P_o$ and $P_u$, respectively, the desired information being recovered such that the weighting factors $P_o$ and $P_u$, respectively, are calculated from the individual transfer functions $q_{io}$ and $q_{iu}$, i = 1, ..., n, of the n phase shifters, respectively, at the frequencies of the upper and lower side bands, and the number $\mu$ of the phase shifters switched into the second state in accordance with the relationships:

$$\underline{P}_o = (-1)^\mu \prod_{i=1}^{n} \frac{1}{q_{iu}^*} \tag{D}$$

$$\underline{P}_u = (-1)^\mu \prod_{i=1}^{n} \frac{1}{q_{io}} \tag{E}$$

7. The measurement defined in claim 6 wherein:
(a) unsymmetrical first side bands are generated by the additional modulation;
(b) one signal component is modulated only with two of said phase shifters;
(c) through the modulation frequency of the low-frequency, additional modulation and the phase shifters which are used, the individual transfer functions of the phase shifters $q_i$ in the upper and lower side bands are set to be identical to one another;
(d) the four complex measured filtered-output voltages corresponding to $U_{F1}$ in which no phase shifter is shifted to the second state, $U_{F2}$ in which a first of said phase shifters is shifted to the second state, $U_{F3}$ in which the second of said phase shifters is shifted to the second state, and $U_{F4}$ in which both of said phase shifters are shifted to the second state, and said voltages, $U_{F1}-U_{F4}$, are combined to the auxiliary magnitude $k_1^*$ as follows:

$$\underline{k}_1^* = -\frac{IM\{\underline{U}_{F1}^*\underline{U}_{F4} + \underline{U}_{F2}^*\underline{U}_{F3}\}}{2IM\{\underline{U}_{F1}\underline{U}_{F3}^*\}} \tag{F}$$

$$+/- j\sqrt{-\frac{IM\{\underline{U}_{F1}^*\underline{U}_{F4} + \underline{U}_{F2}^*\underline{U}_{F3}\}^2}{4IM\{\underline{U}_{F1}\underline{U}_{F3}^*\}^2} + \frac{IM\{\underline{U}_{F2}\underline{U}_{F4}^*\}}{IM\{\underline{U}_{F1}\underline{U}_{F3}^*\}}}$$

and
(e) the desired information is recovered, either in accordance with the relationship $$\underline{H}_{Ro} = \frac{\underline{U}_{F1}\underline{k}_1^* - \underline{U}_{F2}}{2jIM\{\underline{k}_1^*\}} \tag{G}$$

or in accordance with the relationship $$\underline{H}_{Ru} = \frac{U^*_{F1}k^*_1 - U^*_{F2}}{2jIM\{k^*_1\}} \quad \text{(H)}$$

wherein $H_{Ro}$ and $H_{Ru}$ are selectively determined by these relationships directly from the measured values.

8. The improvement defined in claim 3 wherein:
(a) one of said signal components is additionally modulated with a low-frequency signal of the frequency f,
(b) the $2^n$ combinations of the n transfer phases are established in a single time periodic operation,
(c) the weighting of the mixed products is effected with $\pm 1$, $\pm j$ by a phase shifting thereof through $0°/180°/90°/270°$, and
(d) the desired information is so recovered from the phase-shifted mixed product that the latter band is filtered at the frequency of the low-frequency modulation, and amplitude and phase of the resulting signal are determined.

9. The improvement defined in claim 8 wherein:
(a) the band filtration of the mixed product of the frequency is effected such that this frequency corresponds to the sum of the low-frequency modulation frequency f and the repetition frequency $2^{(n-2)}f$ of the control for the phase-shifter chain, and
(b) the weighting is carried out such that a mixed product is phase shifted by 0° or 180° whereby the $2^n$ switching combinations of the phase-shifter chain are distributed over $2^n$ partial intervals under conditions such that for 0° low-frequency phase shift in the 1, 5, 9, ... partial intervals of one period where each period is divided into 1, 2, 3, 4, 5, 6, 7, 8, 9, 10, 11, ... i ... $2^n$ partial intervals, the 0, 4, 8 ... switch states are generated by the phase shifters while in the 2, 6, 10 ... partial intervals of the period, the 1, 5, 9 ... phase-shifter states are switched and in the 3, 7, 11 ... partial intervals of this period, the 2, 6, 10 ... switched phase shifter states are established, and in the 4, 8, 12 ... partial intervals of this period, the 3, 7, 11 ... switched phase shifter states are established, and for the 0° low-frequency phase shift in the $i^{th}$ partial interval, the state is established by switching of a 180° low-frequency phase shift in the $(i+2)^{th}$ partial interval.

10. A circuit arrangement for determining the amplitude ratio and the phase difference of two signals of the same frequency, which are modulated and then mixed with one another to form a low-frequency signal from which information is obtained with respect to a reference measurement and wherein:
(a) only one signal component is modulated with a chain of phase shifters whose individual transfer phases can each have two states;
(b) the modulation is carried out so that within a measuring period, one after the other, all $2^n$ combinations of the transfer phases of the n phase shifters are established;
(c) the mixing of said two signals forms a product of the signals; and
(d) the desired information is recovered from a low-frequency component of the mixed product of both signals by combining $2^n$ voltage values, respectively corresponding to the $2^n$ switching states of the phase shifter during a measuring period to a complex sum $H_R$, in which each voltage value is weighted with an individual complex factor P which contributes to the complex sum and the individual weighting factor P of each switching state is given in terms of the individual transfer functions $q_i$, $i = 1, \ldots n$ for the respective switching states and n phase shifters and by the number $\mu$ of the phase shifters which have their transfer phases in the second state as follows:

$$P = (-1)^\mu \prod_{i=1}^{n} \frac{1}{q_i^*} \quad \text{(A)}$$

said circuit arrangement comprising a high-frequency oscillator and a register for the information with respect to said measurement, said circuit arrangement further comprising:
(A) a signal divider (2) having a measuring branch (3) and a reference branch (4) connected to said oscillator; and
(B) a chain in said measuring branch (3) of n switchable phase shifters switchable between 0° and at least 90° into at least two states, the phase shifters (5,6) being provided with a controller (9) for establishing all $2^n$ switch combinations of the phase shifter;
(C) a mixer receiving signals from both of said branches, a measured object (10) being connected between said phase shifters (5, 6 ...) and said mixer (11); and
(D) a band-pass filter (12, 22) connected to said mixer (11) and provided with a calculating circuit (14, 15, 28, 29) for calculating amplitude and phase of an output signal from said mixer, and delivering corresponding values thereof to said register (18).

11. The circuit arrangement defined in claim 10 wherein said calculating circuits includes a subtraction circuit (13) controlled by said controller, and an addition circuit (14) connected to said subtraction circuit, and a computer (15) connected to said addition circuit, said computer and said addition circuit also responding to said controller and being connected thereto.

12. The circuit arrangement defined in claim 10 wherein said measuring branch (3) is provided with a high-frequency modulator operated with a low-frequency periodic signal $f_2$ by a low-frequency oscillator (21), said band-pass filter (22) being connected to a low-frequency modulator (23) operated by said frequency $f_2$ by said low-frequency oscillator (21) so that low-frequency modulator (23) forms a product modulator.

13. The circuit arrangement defined in claim 10 wherein said measuring branch (3) includes a switch (8) which in a closed state enables the $2^n$ switch combinations to be formed and in an open state permits the signal from the measured object to be passed to the mixer.

14. The circuit arrangement defined in claim 10 wherein a high-frequency modulator (20) is provided in the measuring branch (3) and is operated with a low-frequency signal $f_2$ by a low-frequency oscillator (21), said high-frequency modulator forming symmetrical first side bands with a predetermined frequency spacing, a peak-value generator (25) and a phase-comparison circuit (26) being connected to said band-pass filter and controlled by said low-frequency oscillator.

15. The circuit arrangement defined in claim 10 wherein said measuring branch (3) includes a high-frequency modulator (20) controlled at a frequency $f_2$ by a low-frequency oscillator (21), an amplitude-measuring circuit (28) and a phase-measuring circuit (29) forming part of said calculating means, being connected to said band-pass filter, said phase-measuring circuit (29) receiving an input from said low-frequency oscillator.

16. The circuit arrangement defined in claim 10 wherein a 0°/90°/180°/270° phase shifter (27) is connected between said mixer and said band-pass filter and said calculating means includes an amplitude-measuring circuit for measuring relative amplitude and high-frequency signals passing through said measured object and a phase-measuring circuit (29) in parallel with said amplitude-measuring circuit (28) for comparison of the phase of the low-frequency signals from said band-pass filter with the phase of a low-frequency oscillator (21) connected to a modulator (20) in said measuring branch.

17. The circuit arrangement defined in claim 10 wherein a low-frequency phase shifter (27) in the form of a 0°/180° phase shifter is provided between said mixer and said band-pass filter.

18. The circuit arrangement defined in claim 17 wherein said low-frequency phase shifter is connected in a single branch (30) of said modulator (20).

19. The circuit arrangement defined in claim 10 in which to determine the relative amplitude and relative phase of signals reflected from the measured object, a further signal divider is provided in said reference branch together with a rectifier with a mixer connected thereto which is controlled by a reference signal from the reference branch and which feeds the measuring branch ahead of the measured object.

* * * * *